US011056853B2

(12) United States Patent
Matsuhama

(10) Patent No.: US 11,056,853 B2
(45) Date of Patent: Jul. 6, 2021

(54) METHOD OF MANUFACTURING SEMICONDUCTOR LASER ELEMENT, AND SEMICONDUCTOR LASER DEVICE THEREOF AND GAS ANALYZER

(71) Applicant: HORIBA, LTD., Kyoto (JP)

(72) Inventor: Makoto Matsuhama, Kyoto (JP)

(73) Assignee: HORIBA, LTD., Kyoto (JP)

( * ) Notice: Subject to any disclaimer, the term of this patent is extended or adjusted under 35 U.S.C. 154(b) by 0 days.

(21) Appl. No.: 16/415,757

(22) Filed: May 17, 2019

(65) Prior Publication Data

US 2019/0356108 A1 Nov. 21, 2019

(30) Foreign Application Priority Data

May 18, 2018 (JP) .............................. JP2018-096588

(51) Int. Cl.
*H01S 5/028* (2006.01)
*H01S 5/00* (2006.01)
*H01S 5/02* (2006.01)
*G01N 21/31* (2006.01)
*H01S 5/34* (2006.01)
*H01S 5/12* (2021.01)
*H01S 5/22* (2006.01)

(52) U.S. Cl.
CPC .......... *H01S 5/0014* (2013.01); *G01N 21/31* (2013.01); *H01S 5/0207* (2013.01); *H01S 5/028* (2013.01); *H01S 5/0217* (2013.01); *H01S 5/0287* (2013.01); *H01S 5/12* (2013.01); *H01S 5/22* (2013.01); *H01S 5/3402* (2013.01)

(58) Field of Classification Search
CPC ...... H01S 5/0202; H01S 5/0203; H01S 5/028; H01S 5/0285; H01S 5/026; G01N 21/31
See application file for complete search history.

(56) References Cited

U.S. PATENT DOCUMENTS

| 4,470,143 A * | 9/1984 | Kitamura ............... H01S 5/0264 257/E33.076 |
| 6,835,581 B2 * | 12/2004 | Fitz ........................ H01S 5/028 372/49.01 |
| 2002/0061044 A1 * | 5/2002 | Kuniyasu .................. H01S 5/22 372/46.012 |
| 2006/0187985 A1 * | 8/2006 | Behfar ...................... G02F 1/17 372/44.01 |
| 2008/0301595 A1 * | 12/2008 | Thiyagarajan ............ H01S 5/12 716/132 |
| 2009/0086778 A1 | 4/2009 | Kameyama et al. |
| 2010/0327257 A1 | 12/2010 | Yamamoto et al. |
| 2015/0357794 A1 | 12/2015 | Tsuji |
| 2018/0059003 A1 * | 3/2018 | Jourdainne ........ G01N 33/0054 |
| 2019/0221999 A1 * | 7/2019 | Kawakami ............ H01S 5/1082 |

FOREIGN PATENT DOCUMENTS

JP    2001-094194 A    4/2001

OTHER PUBLICATIONS

EESR dated Dec. 12, 2019 issued for European Patent Application No. EP19 174 605.6, 6 pgs.

* cited by examiner

*Primary Examiner* — Michael Carter
(74) *Attorney, Agent, or Firm* — Brooks Kushman P.C.

(57) ABSTRACT

In order to form a reflection film on a rear end facet of a waveguide more easily than conventional, by etching a laminated structure formed on a substrate, a plurality of waveguides segmented in a lattice shape are formed, and a reflection film is formed on a surface of each of the waveguides for reflecting light in each of the waveguides.

8 Claims, 10 Drawing Sheets

< PREPARING SEMICONDUCTOR SUBSTRATE >

< CRYSTAL GROWTH >

< DIFFRACTION GRATING FORMATION >

< CRYSTAL GROWTH (EMBEDDED GROWTH) >

METHOD OF MANUFACTURING SEMICONDUCTOR LASER ELEMENT, AND SEMICONDUCTOR LASER DEVICE THEREOF AND GAS ANALYZER

CROSS-REFERENCE TO RELATED APPLICATION

This application claims priority to Japanese Application No. 2018-096588, filed May 18, 2018, the disclosure of which is incorporated in its entirety by reference herein.

TECHNICAL FIELD

The present invention relates to a method of manufacturing a semiconductor laser element, a semiconductor laser device thereof, and a gas analyzer.

BACKGROUND ART

In manufacturing a semiconductor laser element having a waveguide, in order to extract more light, a reflection film may be formed on a rear end facet opposite to a light emission surface for preventing the light from being released in some cases.

Conventionally, in forming such a reflection film, there has been used a jig as disclosed in Patent Literature 1. Specifically, a multi-layered structure configured by laminating a plurality of semiconductor layers is formed on a substrate, this multi-layered structure is cleaved into a predetermined length to form a light emitting surface and a rear end facet, and then the reflection film is formed on the rear end facet while supporting this cleaved structure using the jig.

However, as described in Patent Document 1, a work using the jig is a delicate work that requires accuracy, and in the case there occurs any damage or dirt on an end facet, laser characteristics are changed and a normal operation may not be performed. In such a case, the subjected semiconductor laser element becomes a defective product.

CITATION LIST

Patent Literatures

Patent Literature 1: Japanese Unexamined Patent Application Publication No. 2001-94194

SUMMARY OF INVENTION

Technical Problem

Therefore, the present invention has been made in order to solve the above-described problems, and a main object thereof is to make it possible to form a reflection film on a rear end facet of a waveguide more easily than in the conventional one.

Solution to Problem

That is, the present invention is directed to a method of manufacturing a semiconductor laser element from a laminated structure formed on a substrate, characterized by including: an etching step of etching the laminated structure to form a plurality of waveguides which are segmented in a lattice shape; and a reflection film forming step of forming a reflection film on a surface of each of the waveguides for reflecting light in each of the waveguides.

With this method of manufacturing the semiconductor laser element, the end facet intersecting with a longitudinal direction of the waveguide segmented in a lattice shape is formed as a rear end facet opposite to the light emitting surface to be formed later. Therefore, the reflection film can be formed on the rear end facet before forming a semiconductor laser element part by cleavage. As a result, it is possible to eliminate the need for the jig necessary for forming the film after cleavage, and it becomes possible to form the reflection film on the rear end facet more easily than in the conventional one.

Furthermore, since the rear end facet of the waveguide is formed by etching, positioning of the rear end facet can be made more precise than in the case where the rear end facet is formed by cleavage. As a result, the length of the waveguide, that is, an optical path length can be precisely set to a desired one, and photoelectric characteristics with less variation can be obtained.

In addition, the reflection films can be formed at a time on a side surface along the longitudinal direction of the waveguide and the end facet intersecting the longitudinal direction of the waveguide in one step of forming the reflection film. Thus, compared to the case of separately forming the reflection films on these surfaces, the number of processes can be reduced.

More specifically, in the etching step, it is preferable that, the side surface along the longitudinal direction of each of the waveguides and the end facet intersecting the longitudinal direction of each of the waveguides are formed, and in the reflection film forming step, it is preferable that, the reflection film is formed on an upper surface of each of the waveguides and on the side surface along the longitudinal direction and on the end facet intersecting the longitudinal direction.

Thus, the reflection films can be formed at once on the upper surface, the side surface, and the rear end facet of the waveguide, and the process of forming the reflection films can be simplified.

It is preferable that, by cleaving each of the waveguides formed with the reflection film along a direction intersecting the longitudinal direction, the method includes a cleaving step of forming the light emitting surface for emitting light within each of the waveguides.

As described above, by forming the light emitting surface after the etching process, the light of a sufficient light quantity can be emitted from the light emitting surface without forming any reflection film on the light emitting surface.

In order to further improve the light quantity of the light emitted from the light emitting surface, it is preferable that the method includes a step of forming an antireflection film on the light emitting surface for preventing the reflection of the light passing through each of the waveguides and emitted from the light emitting surface.

By the way, even if the reflection film is formed on the rear end facet as described above, there may be a case where a laser beam leaks from the rear end facet. Then, the laser beam is irregularly reflected, for example, in a casing that accommodates the semiconductor laser element part and is guided to a light emitting window formed in the casing, which may cause a noise undesirably.

Therefore, in the cleaving step, it is preferable that, by cleaving each of the waveguides segmented in the lattice shape in the direction intersecting the longitudinal direction, a part of one of the waveguides adjacent in the longitudinal direction is formed as a remaining part corresponding to the other waveguide.

In this method, since the remaining part is formed at a position facing the end facet intersecting with the longitudinal direction of each of the waveguides to be the rear end facet, the laser beam leaked from the rear end facet can be cut by this remaining part. Thus, it is possible to prevent the leaked laser beam from being irregularly reflected toward the light emitting window.

Since the remaining part described above has the same layer configuration as the waveguide, as one utilization example of the remaining part, the remaining part may be used as a temperature sensor for detecting a temperature of the semiconductor laser element.

From this, the temperature of the semiconductor laser element part can be accurately controlled.

In the etching step, it is preferable that, an exposed surface segmenting the plurality of waveguides in a lattice shape is formed on the substrate, and the etching step further includes a separation step for separating the waveguides adjacent to each other in a direction intersecting the longitudinal direction by the exposed surface disposed along the longitudinal direction.

From this, a plurality of semiconductor elements can be obtained in the separation step.

Further, a semiconductor laser device according to the present invention includes a substrate and a semiconductor laser element provided on the substrate, and in this configuration, the semiconductor laser element includes a waveguide composed of a part of a laminated structure formed on the substrate, and a reflection film continuously and integrally formed on a side surface along the longitudinal direction of the waveguide and on an end facet intersecting the longitudinal direction, and reflecting the light within the waveguide.

Furthermore, a gas analyzer according to the present invention is configured to analyze a measurement target component contained in gas, includes: a measurement cell into which the gas is introduced; the above-mentioned semiconductor laser device for irradiating the measurement cell with laser light; a photodetector for detecting the laser light that has passed through the measurement cell; and an analyzing part for analyzing the measurement target component based on a detection signal of the photodetector.

With such a configuration as described above, since the film can be formed prior to forming the semiconductor laser element part by cleaving, the jig can be omitted similarly to the method of manufacturing the semiconductor laser device described above, and it becomes possible to form the reflection film on the rear end facet more easily than in the conventional manner.

Advantageous Effects of Invention

According to the present invention configured as described above, the reflection film can be formed on the rear end facet of the semiconductor element portion more easily than in the conventional manner.

DESCRIPTION OF EMBODIMENTS

In the following, one embodiment of a semiconductor laser device according to the present invention will be described with reference to the drawings.

Figure 1:
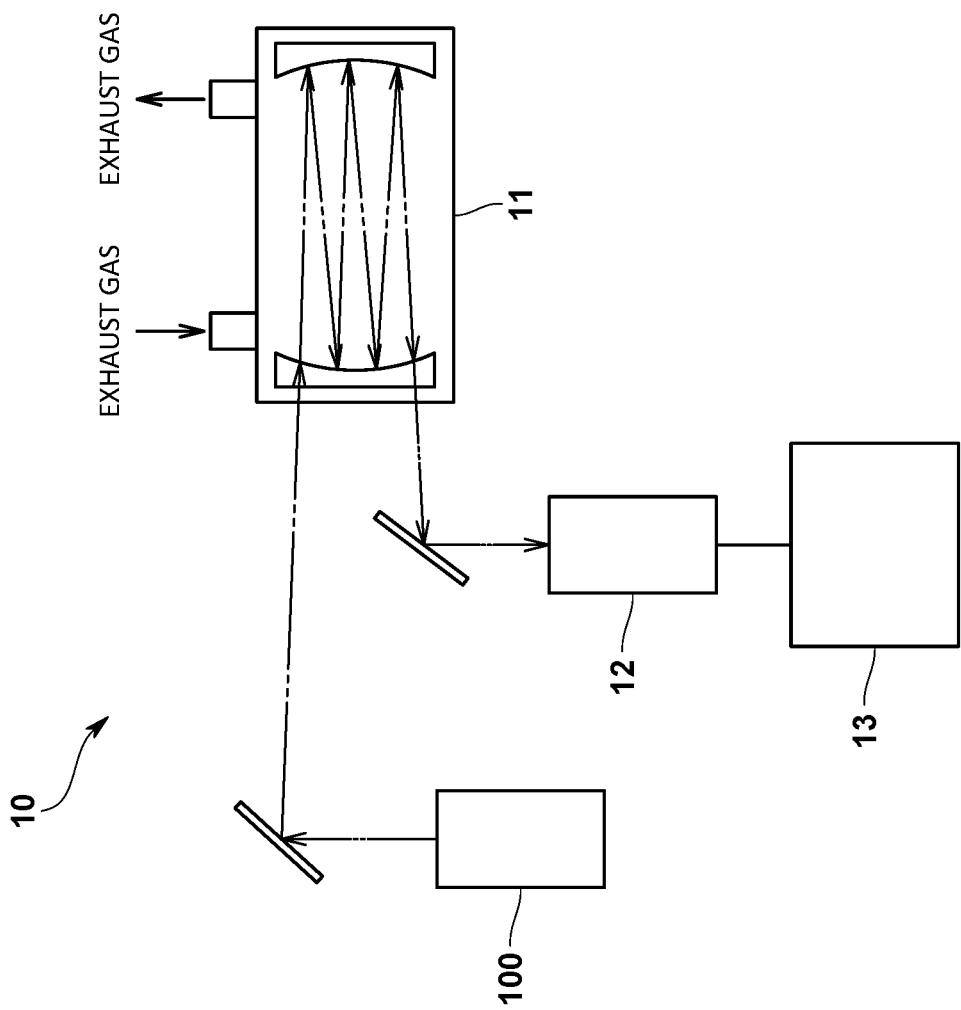
FIG. 1 is an entire schematic view of an exhaust gas analyzer in which a semiconductor laser device according to the present embodiment is used.

As shown in FIG. 1, the semiconductor laser device 100 of the present embodiment is used in an exhaust gas analyzer 10 for analyzing a measurement target component contained in exhaust gas exhausted from, for example, an internal combustion engine. Here, the exhaust gas analyzer 10 includes: a multiple reflection type measurement cell 11 into which the exhaust gas is introduced; a semiconductor laser device 100 for irradiating the measurement cell 11 with laser light; a photodetector 12 for detecting the laser light that has passed through the measurement cell 11; and an analyzing unit 13 for analyzing the measurement target component using a detection signal of the photodetector 12.

Figure 2:
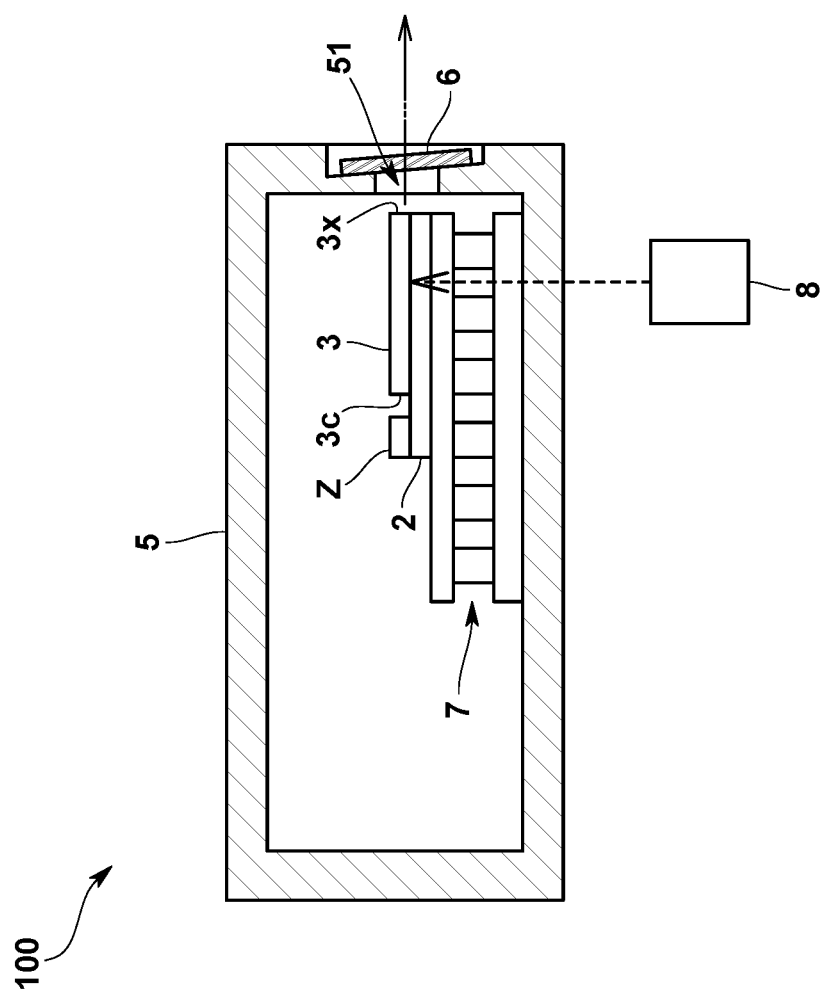
FIG. 2 is an entire schematic view of the semiconductor laser device according to the same embodiment.
Figure 3:
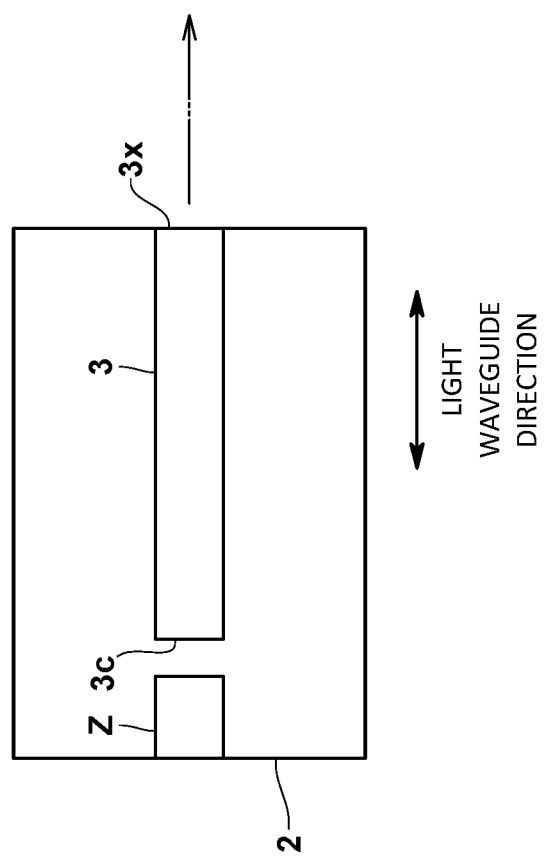
FIG. 3 is a plan view schematically showing an arrangement of the semiconductor laser device according to the same embodiment.

Specifically, the semiconductor laser device 100 emits laser light having an oscillation wavelength of $\pm 1$ $cm^{-1}$ with respect to an absorption wavelength of the measurement target component. As shown in FIGS. 2 and 3, the semiconductor laser device 100 includes a semiconductor substrate 2 such as an InP substrate and a semiconductor laser element part 3 formed on the semiconductor substrate 2.

Moreover, the semiconductor substrate 2 provided with the semiconductor laser element part 3 is accommodated in an airtight container 5 such as a butterfly package. In this airtight container 5, a light lead-out portion 51 for leading the laser light to the outside is formed at a portion opposed to a light emitting surface 3x of the semiconductor laser element portion 3. An optical window member 6 is provided in the light lead-out portion 51, and the optical window member 6 is slightly inclined (for example, 2 degrees) so that the laser light reflected by the member 6 does not return to the semiconductor laser element portion 3 again. In addition, in order for cooling the semiconductor laser element portion 3, there is also accommodated such as a cooling module 7 in the airtight container 5.

Figure 4:
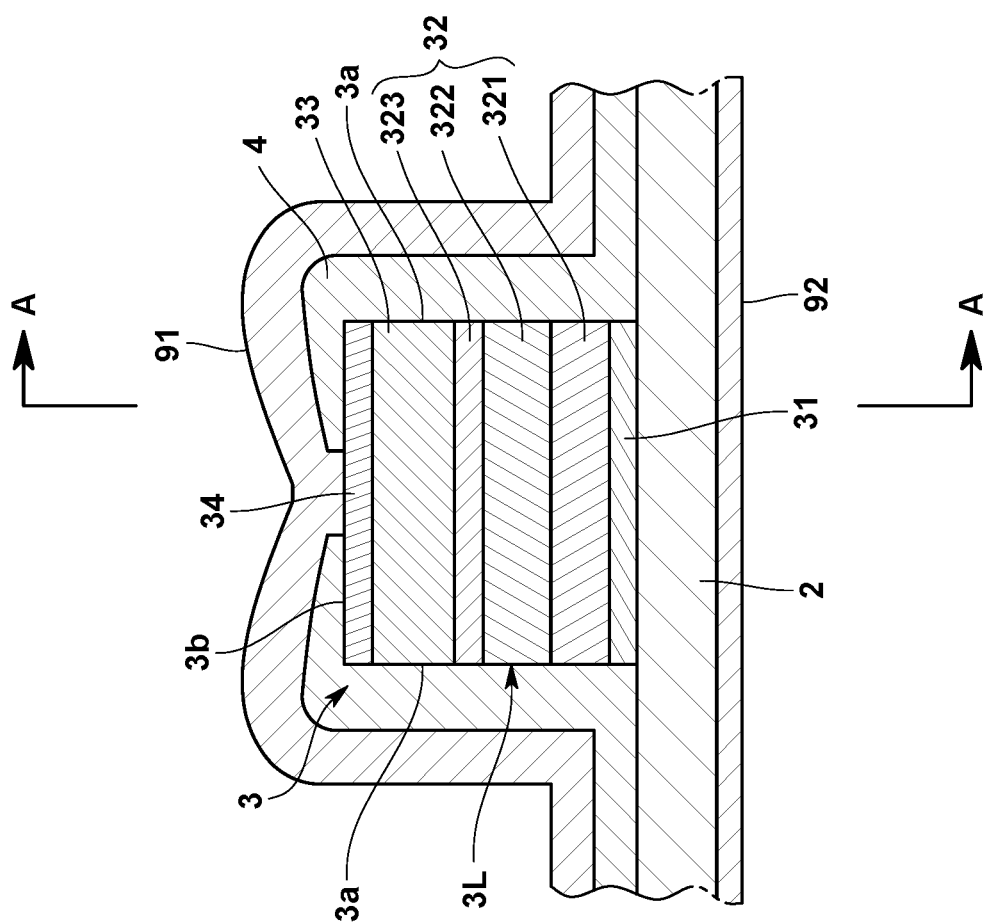
FIG. 4 is a cross-sectional view orthogonal to a light guiding direction of a semiconductor laser element part according to the same embodiment.
Figure 5:
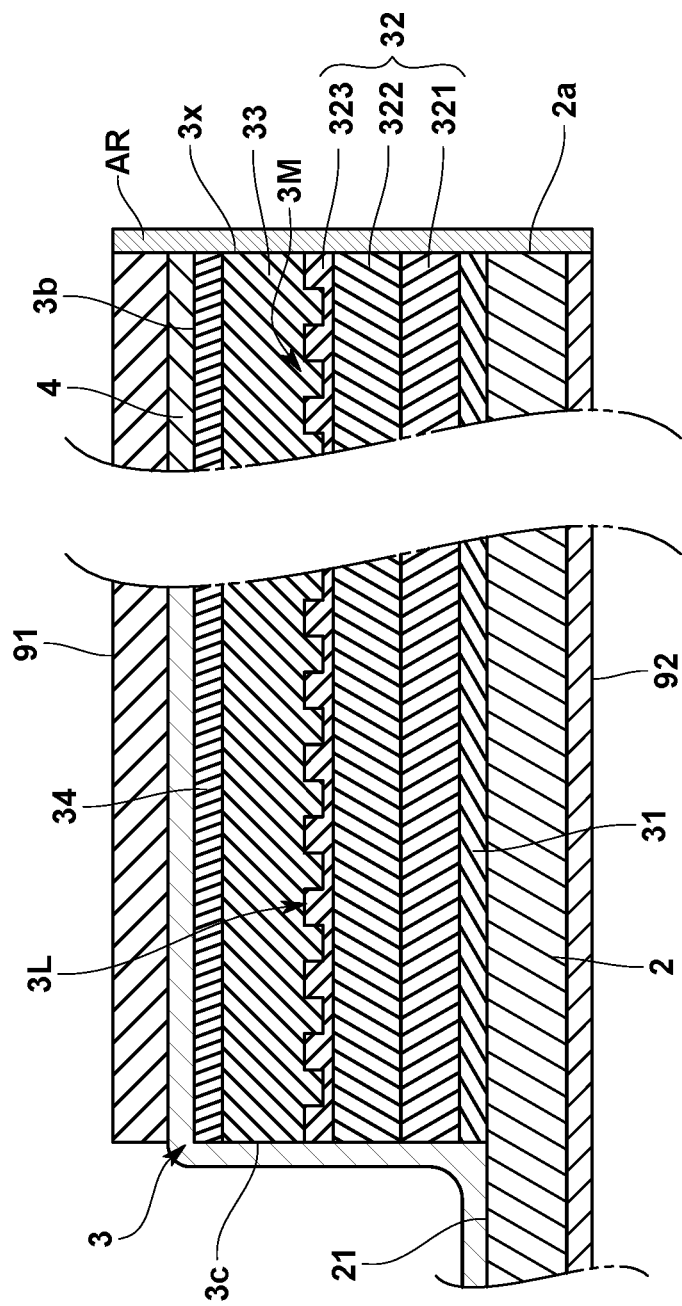
FIG. 5 is a cross-sectional view of the semiconductor laser element part according to the same embodiment, taken along a line A-A.

As shown in FIGS. 4 and 5, the semiconductor laser element part 3 is a distributed feedback laser (DFB laser), and it includes a waveguide 3L which includes a cladding layer and a core layer, provided on the semiconductor substrate 2. In this waveguide 3 L, the laser light passes through the core layer due to difference between a refractive index of the cladding layer and that of the core layer.

Specifically, the semiconductor laser element part 3 is composed of, a buffer layer 31, a core layer 32, an upper cladding layer 33 and a cap layer 34, which are formed on the upper surface of the semiconductor substrate 2 in this order. In addition, all these layers 31 to 34 extend in the same direction.

Both the buffer layer 31 and the upper cladding layer 33 are made of InP. In this configuration, a lower cladding layer made of InP may be provided between the buffer layer 31 and the core layer 32, or the buffer layer 31 may be functioned as a cladding layer.

The cap layer 34 is made of InGaAs, and a part of the upper surface (a central portion in a width direction) thereof is covered by an upper electrode 91.

The core layer 32 includes a lower guide layer 321 made of InGaAs, an active layer 322 emitting light upon charging electric current, and an upper guide layer 323 made of InGaAs.

The active layer 322 has a multiple quantum well structure including a plurality of well layers, and it is configured by alternately laminating a predetermined number of semiconductor layers to be a light emitting region and semiconductor layers to be an injection region. The semiconductor layers to be the light emitting region are configured by alternately laminating the layers made of InGaAs and those made of InAlAs. Meanwhile, the semiconductor layers to be the injection region are configured by alternately laminating the layers made of InGaAs and those made of InAlAs.

Figure 6:
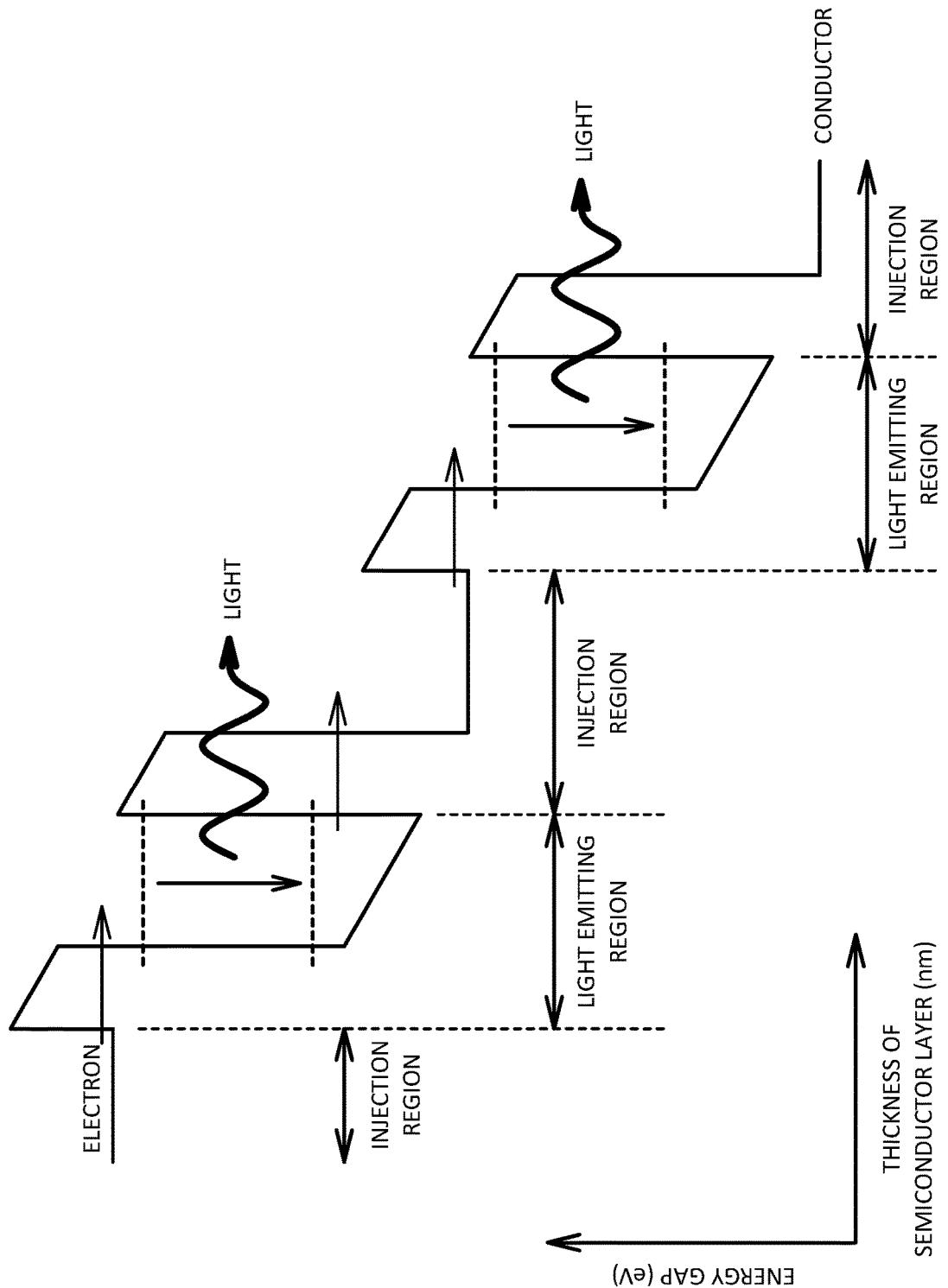
FIG. 6 is a diagram showing a light emission principle of a quantum cascade laser.

In the semiconductor laser element part configured as described above, as shown in FIG. 6, a plurality of well layers are connected in multiple stages, and it is configured as a quantum cascade laser that emits light by an optical transition between sub-bands formed in the quantum wells.

In the semiconductor laser element part 3, a diffraction grating 3M is formed between the core layer 32 and the upper cladding layer 33, that is, on the upper guide layer 323 (see FIG. 5). The diffraction grating 3M is composed of concave portions and convex portions alternately formed on the upper guide layer 323, and the concave portions and the convex portions extend in a width direction of the upper guide layer 323. The light having a predetermined oscillation wavelength is intensified and selectively amplified by this diffraction grating 3M. The predetermined oscillation wavelength is defined by a pitch of the diffraction grating 3M.

A lower electrode 92 is provided on a lower surface of the semiconductor substrate 2, i.e., a position located below the semiconductor laser element part 3. Thus, by applying current (or voltage) for laser oscillation to the upper electrode 91 and the lower electrode 92, the laser light of the predetermined oscillation wavelength defined by the diffraction grating 3M is emitted. A current source (or voltage source) is connected to the upper electrode 91 and the lower electrode 92 for laser oscillation, and a laser control device 8 controls the current source (or voltage source) (see FIG. 2).

In the semiconductor laser element part 3 described above, there is provided a reflection film 4 for reflecting light so as to cover the waveguide 3L. Here, since a method of forming the reflective film 4 is characteristic, a method of manufacturing the semiconductor laser device 100 will be described in detail with reference to FIGS. 7 to 9 below.

<Method of Manufacturing Semiconductor Laser Device>

Figure 7:
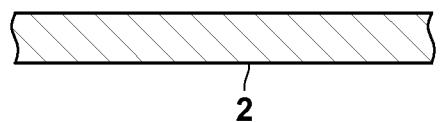
FIG. 7 is a schematic view showing a former stage of a manufacturing process of the semiconductor laser element part according to the same embodiment.
Figure 7:
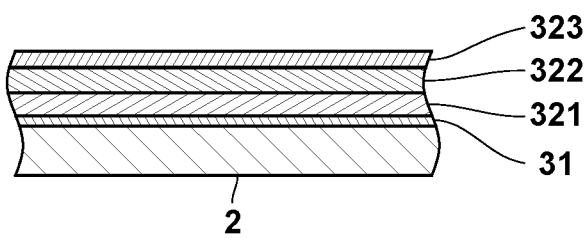
Figure 7:
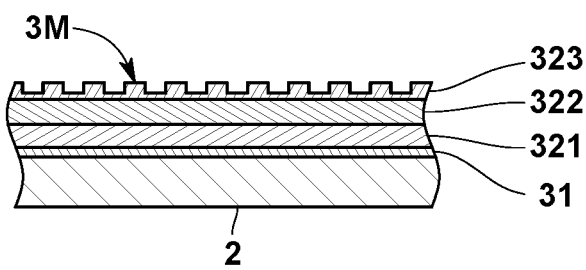
Figure 7:
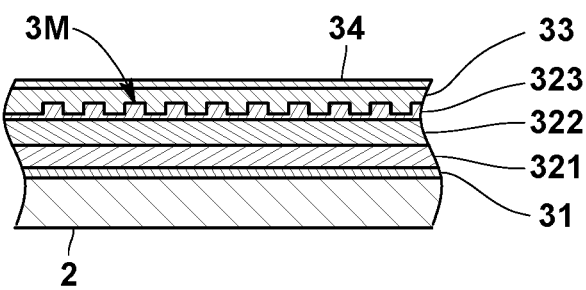

First, as shown in FIG. 7, the semiconductor substrate 2 is prepared, and an InP layer to be the buffer layer 31, an InGaAs layer to be the lower guide layer 321, an InGaAs layer and an InAlAs layer to be the active layer 322, and an InGaAs layer to be the upper guide layer 323 are crystal-grown by a metal organic vapor phase epitaxy method (MOVPE method) and laminated in this order on the upper surface of the semiconductor substrate 2.

Next, the diffraction grating 3M is formed on the upper surface of the upper guide layer 323 by a method of photolithography and wet etching. Then, an InP layer to be the upper cladding layer 33 and an InGaAs layer to be the cap layer 34 are crystal-grown by a metal organic vapor phase epitaxy method (MOVPE method) and laminated in this order above the upper guide layer 323.

Figure 8:
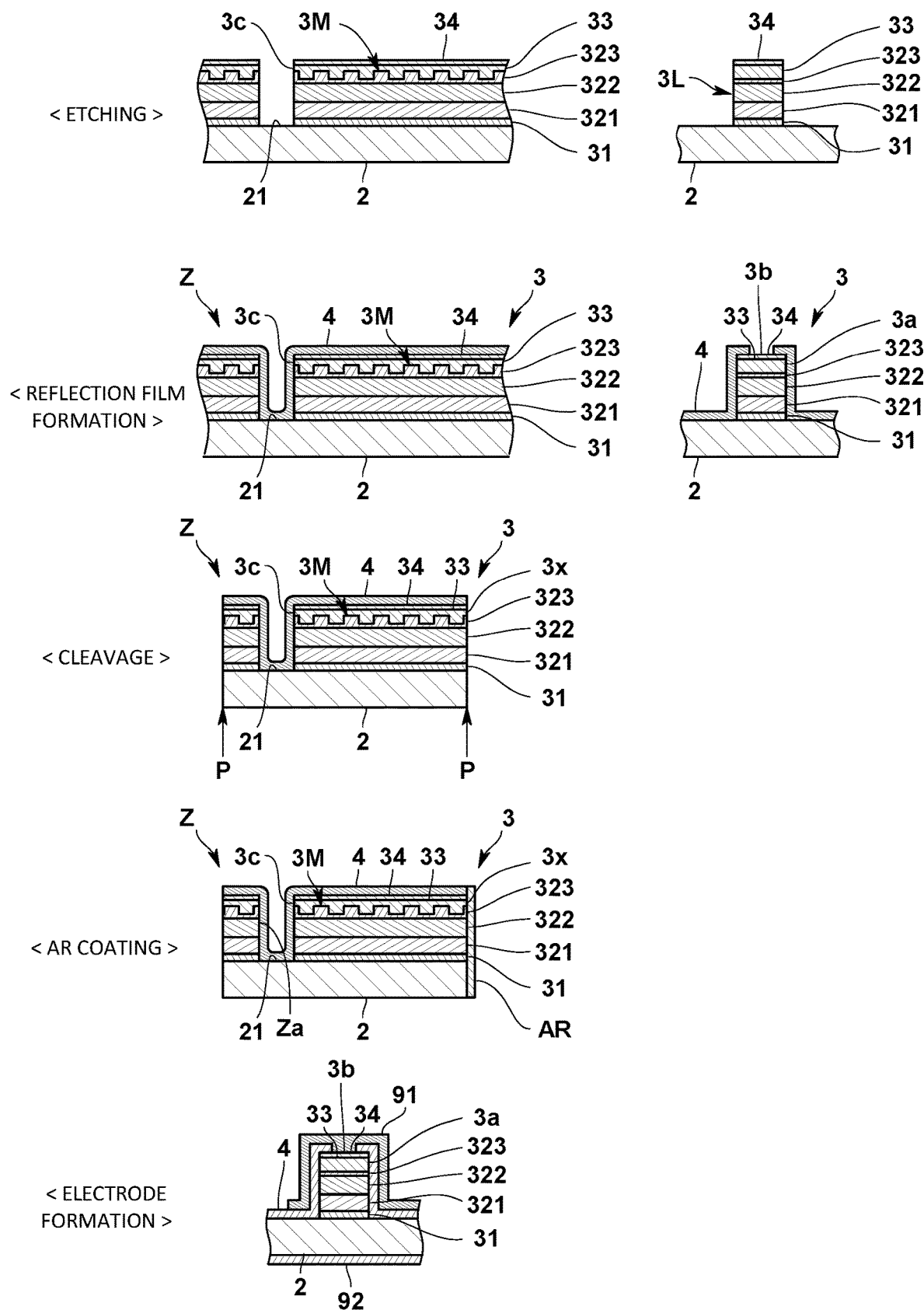
FIG. 8 is a schematic view showing a later stage of the manufacturing process of the semiconductor laser element part according to the same embodiment.
Figure 9:
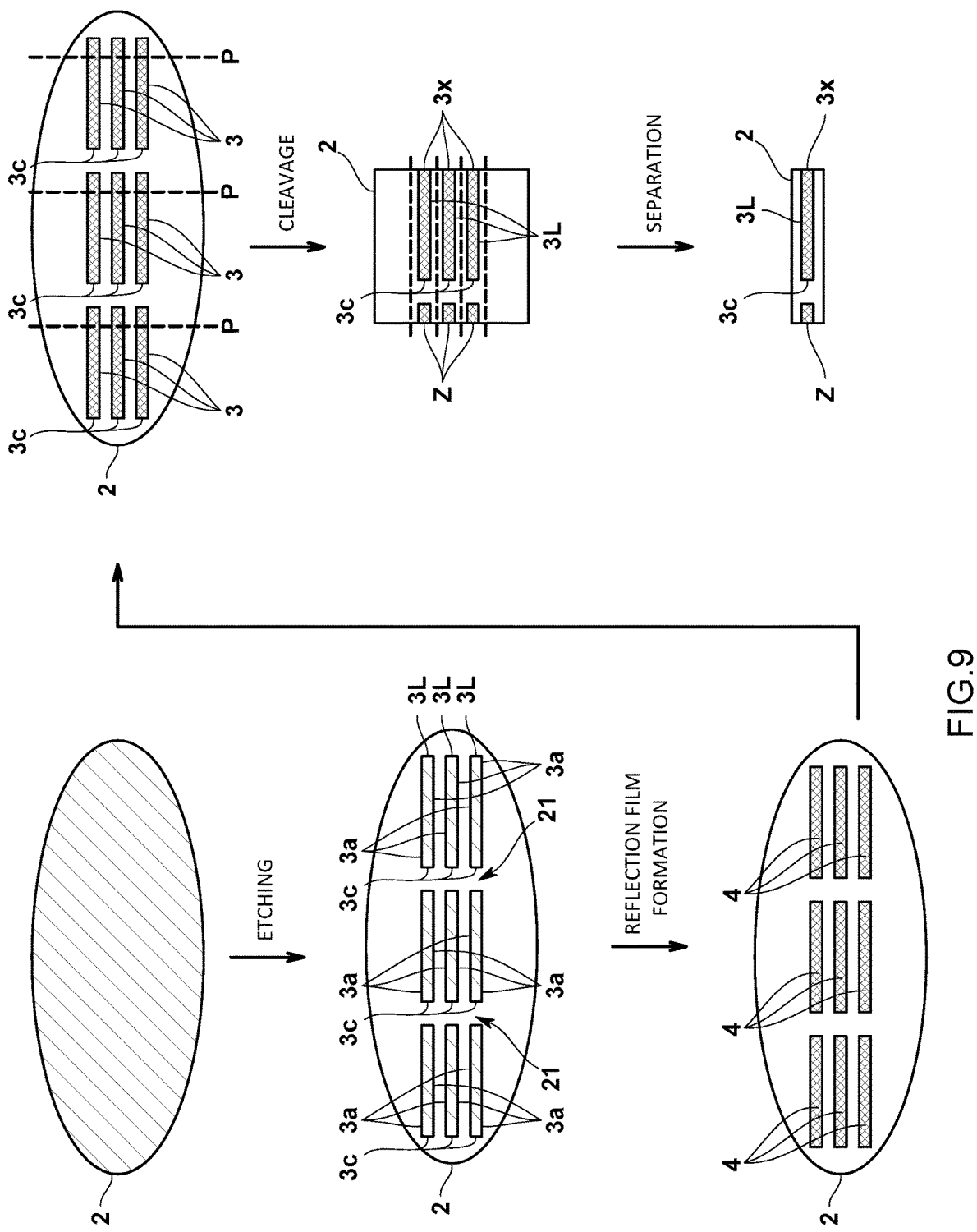
FIG. 9 is a schematic view showing a cleaving position according to the same embodiment.

As shown in FIGS. 8 and 9, by performing wet etching or dry etching on the laminated structure formed in this manner, the waveguide 3L is formed.

Specifically, in this etching process, by etching the above-described laminated structure, there are formed a plurality of waveguides 3L segmented in a lattice shape. That is, the plurality of waveguides 3L are segmented in a grid shape by an exposed surface 21 formed on the surface of the substrate 2. By this etching, there are formed respective side surfaces 3a along the longitudinal direction of the waveguide 3L and an end facet 3c intersecting the longitudinal direction of the waveguide 3L. The end facet 3c is opposite to the light emitting surface 3x to be formed later, and this end facet 3c is formed as a rear end facet 3c of the waveguide 3L.

After the side surfaces 3a along the longitudinal direction of the waveguide 3L and the rear end facet 3c intersecting the longitudinal direction are formed in this way, the reflection film 4 is formed on the surface of the waveguide 3L so as to cover the waveguide 3L. Specifically, by using a film forming apparatus such as a sputtering, vapor deposition, or PCVD apparatus, the reflection film 4 is formed on the side surfaces 3a and a partial portion of the upper surface 3b i.e., except a central portion of the upper surface to be covered by the upper electrode 91 in the width direction thereof along the longitudinal direction of the waveguide 3L.

In this configuration, the reflection film 4 of the present embodiment is an inorganic film, and it may be a dielectric film made of, for example, $SiO_2$, a combination of $SiO_2$ and $Si_3N_4$ or the like, or may be a metal film such as an Au film, or may be formed by superposing a dielectric film and a metal film.

Then, in the film forming process, as shown in FIGS. 8 and 9, the reflection film 4 is also formed on the rear end facet 3c of the semiconductor laser element part 3. Thus, the reflection film 4 is integrally and continuously formed on the side surfaces 3a, the upper surface 3b and the rear end facet 3c of the waveguide 3L. The reflection film 4 is also integrally and continuously formed on the exposed surface 21 of the semiconductor substrate 2.

Thereafter, the waveguide 3L is cleaved to form the light emitting surface 3x. Specifically, the waveguide 3L is cleaved in a direction (width direction) intersecting the longitudinal direction at a cleavage position P separated by a predetermined length along the longitudinal direction of the waveguide 3L from the rear end facet 3c to a light emitting side. Thus, the light emitting surface 3x is formed and the waveguide 3L is formed to have a desired length.

Regarding the cleavage position P of the present embodiment, as shown in FIG. 9, focusing on the two waveguides 3L adjacent to each other in the longitudinal direction, the cleavage position P for forming the light emitting surface 3x of these waveguides 3L are set so as to straddle the exposed surface 21 formed between these semiconductor element parts 3. Thus, as shown in FIG. 8, a remaining portion Z formed by leaving a part of the semiconductor laser element part adjacent to this semiconductor laser element part 3 is formed further rearward from the rear end facet 3c of the waveguide 3L. In other words, by the cleavage mentioned above, a part of one waveguide 3L adjacent in the longitudinal direction is formed as a remaining part corresponding to the other waveguide 3L. In addition, as shown in FIG. 8, the reflection film 4 is formed on an opposing surface Za which opposes the rear end facet 3c of this remaining part Z.

Thereafter, in order to increase an amount of the light emitted from the light emitting surface 3x, the light emitting surface 3x is coated with an antireflection film AR.

Then, as shown in FIG. 9, the waveguides 3L adjacent in the direction intersecting with the longitudinal direction of the waveguide 3L are separated by the exposed surface 21 along the longitudinal direction. As a specific separation method, dicing (cutting) may be performed based on the exposed surface 21 along the longitudinal direction of the semiconductor substrate 2, or cleavage may be performed, or the waveguides 3L may be divided. Thus, there is obtained one semiconductor laser element having the semiconductor laser element part 3 and the remaining part Z formed on the substrate.

The upper electrode 91 and the lower electrode 92 are formed on the semiconductor laser element part 3 formed as described above, and the semiconductor laser element is disposed in the airtight container 5 in a state of being mounted on the cooling module 7.

Effect of the Present Embodiment

According to this manufacturing method of the semiconductor laser device 100, after the rear end facet 3c of the waveguide 3L is formed by etching, the reflection film 4 is formed on the side surfaces 3a and the upper surface 3b of the waveguide 3L, and therefore, the reflection film 4 is also continuously and integrally formed with the rear end facet 3c. As a result, a special jig is unnecessary for forming the reflection film 4 on the rear end facet 3c, and the reflection film 4 can be formed on the rear end facet 3c more easily than in the conventional method.

Moreover, since the rear end facet 3c is formed by etching, positioning of the rear end facet 3c can be made more precisely than in the case where the rear end facet 3c is formed by cleavage. As a result, the length of the waveguide 3L, i.e., an optical path length can be accurately made to be desired one, and it is possible to obtain photoelectric characteristics with less variation.

Furthermore, in the cleaving process for forming the light emitting surface 3x of the semiconductor laser element part 3, since the waveguides 3L adjacent in the longitudinal direction can be separated, the process can be simplified.

In addition, by providing the remaining part Z behind the rear end facet 3c of the waveguide 3L, even if light leaks from the rear end facet 3c, the light can be blocked by the remaining part Z. Thus, the light leaked from the rear end facet 3c can be prevented from being irregularly reflected toward the optical window member 6 in the airtight container 5, and generation of a noise can be suppressed.

OTHER EMBODIMENTS

The present invention is not limited to the above embodiment.

For example, a temperature of the semiconductor laser element part 3 may be detected using the remaining part Z formed in the above embodiment.

Specifically, similarly to the semiconductor laser element part 3, an upper electrode and a lower electrode are provided on the remaining part Z, and electric current (or voltage) is supplied to these electrodes for temperature detection. Then, by calculating a resistance value of the remaining part Z, the temperature of the remaining part Z can be calculated using the calculated resistance value and, for example, a predetermined resistance value/temperature conversion formula.

Thus, upon calculation of the temperature of the remaining part Z, since the semiconductor laser element part 3 and the remaining part Z have the same layer configuration, the temperature of the remaining part Z can be regarded as the temperature of the semiconductor laser element part 3, and the temperature of the semiconductor laser element part 3 can be controlled with high accuracy.

In the embodiment, the cleavage position P is set on the light emitting side with respect to the rear end facet 3c and on the rear side with respect to the exposed surface 21. However, as shown in the upper part of FIG. 10, it may be set in the exposed surface 21.

If this is the case, since the remaining part Z is eliminated, the laser element part 3 can be manufactured efficiently.

Figure 10:
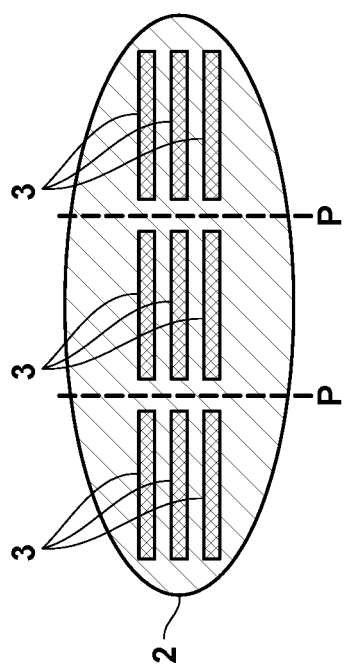
FIG. 10 is a schematic view showing a cleaving position according to the other embodiment.
Figure 10:
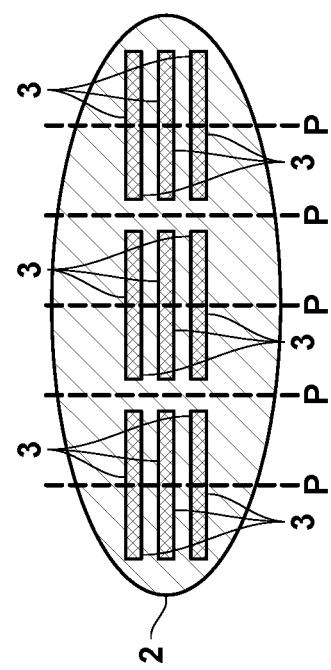

Further, as another aspect, as shown in the lower part of FIG. 10, there may be considered an aspect that the cleavage position P is set so as to pass through the central portion in the longitudinal direction of the laminated structure before performing the cleavage process.

With this arrangement, by cleaving at the cleavage position P, the semiconductor laser element parts 3 having substantially the same length can be formed before and after the cleavage position P. Therefore, the remaining part Z can be eliminated, and the laser element part 3 can be manufactured efficiently.

Although the side surfaces 3a and the rear end facet 3c of the semiconductor laser element part 3 are formed in the same etching process in the above embodiment, the side surfaces 3a and the rear end facet 3c may be formed by separate etchings.

Although the semiconductor laser device having the quantum cascade laser element is described in the above embodiment, the semiconductor laser device may have the other type semiconductor laser element (for example, a distributed reflection type laser (DBR laser) element).

As a driving method of the semiconductor laser element part 3, a continuous oscillation (CW) method, a pseudo continuous oscillation (pseudo CW) method, or a pulse oscillation method may be used.

Although the example applying the semiconductor laser device to the gas analyzer is described in the above embodiment, the semiconductor laser device may be applied to the other optical analyzer and may be also used for an optical communication application.

Further, an analysis target is not limited to exhaust gas, but may be various gases such as atmosphere, or may be liquid.

In addition, it goes without saying that the present invention is not limited to the embodiments described above, and various modifications can be made without departing from the spirit of the present invention.

REFERENCE SIGNS LIST

100 . . . Semiconductor laser device
2 . . . Semiconductor substrate
3 . . . Semiconductor laser element part
3x . . . light emitting surface
3a . . . Side surface
3b . . . Upper surface
3c . . . Rear end facet 4 . . . Reflection film
AR . . . Antireflection film

The invention claimed is:

1. A method of manufacturing a semiconductor laser element from a laminated structure formed on a substrate, comprising:
   laminating a predetermined number of semiconductor layers to be a light emitting region and semiconductor layers to be an injection region to form an active layer having a multiple quantum well structure including a plurality of well layers;
   etching the laminated structure to form a plurality of waveguides which are segmented in a lattice shape, a side surface along a longitudinal direction of each of the waveguides, and an end facet intersecting the longitudinal direction of each of the waveguides;
   forming a reflection film on an upper surface of each of the waveguides, on the side surface along the longitudinal direction, and on the end facet intersecting the longitudinal direction for reflecting light in each of the waveguides; and
   cleaving each of the waveguides formed with the reflection film, along a direction intersecting the longitudinal direction to form a light emitting surface for emitting light within each of the waveguides.

2. The method of manufacturing the semiconductor laser element according to claim 1, further comprising forming an antireflection film on the light emitting surface for preventing reflection of light passing through each of the waveguides and emitted from the light emitting surface.

3. The method of manufacturing the semiconductor laser element according to claim 1, wherein by cleaving each of the waveguides segmented in the lattice shape in the direction intersecting the longitudinal direction, a part of one of the waveguides adjacent in the longitudinal direction is formed as a remaining part corresponding to the other waveguide.

4. The method of manufacturing the semiconductor laser element according to claim 3, wherein the remaining part is used as a temperature sensor for detecting a temperature of the semiconductor laser element.

5. The method of manufacturing the semiconductor laser element according to claim 1, wherein an exposed surface segmenting the waveguides in the lattice shape is formed on the substrate during the etching, further comprising separating the waveguides adjacent to each other in a direction intersecting the longitudinal direction by the exposed surface arranged along the longitudinal direction.

6. A semiconductor laser device including a substrate and a semiconductor laser element provided on the substrate, wherein the semiconductor laser element comprises:
   a waveguide composed of a part of a laminated structure formed on the substrate, and comprising an active layer having a multiple quantum well structure including a plurality of well layers, formed by laminating a predetermined number of semiconductor layers to be a light emitting region and semiconductor layers to be an injection region; and
   a reflection film continuously and integrally formed on a side surface along a longitudinal direction of the waveguide and on an end facet intersecting the longitudinal direction of the waveguide, and reflecting the light within waveguide.

7. A gas analyzer configured to analyze a measurement target component contained in gas, comprising:
   a measurement cell into which the gas is introduced;
   the semiconductor laser device according to claim 6 for irradiating the measurement cell with laser light;
   a photodetector for detecting the laser light that has passed through the measurement cell; and
   an analyzing part for analyzing the measurement target component based on a detection signal of the photodetector.

8. A method of manufacturing a semiconductor laser element from a laminated structure formed on a substrate, comprising:
   etching the laminated structure to form a plurality of waveguides segmented in a lattice shape;
   forming a reflection film on a surface of each of the waveguides for reflecting light in each of the waveguides; and
   cleaving each of the waveguides formed with the reflection film along a direction intersecting a longitudinal direction to form a light emitting surface for emitting light within each of the waveguides such that a part of one of the waveguides adjacent in the longitudinal direction is formed as a remaining part corresponding to the other waveguide, wherein the remaining part is used as a temperature sensor for detecting a temperature of the semiconductor laser element.

* * * * *